United States Patent
Gomez

(10) Patent No.: US 8,457,574 B2
(45) Date of Patent: Jun. 4, 2013

(54) FRONT-END INTEGRATED CIRCUIT FOR TELEVISION RECEIVERS

(75) Inventor: Ramon Gomez, San Juan Capistrano, CA (US)

(73) Assignee: Broadcom Corporation, Irvine, CA (US)

( * ) Notice: Subject to any disclaimer, the term of this patent is extended or adjusted under 35 U.S.C. 154(b) by 1703 days.

(21) Appl. No.: 11/878,751

(22) Filed: Jul. 26, 2007

(65) Prior Publication Data

US 2008/0198269 A1 Aug. 21, 2008

Related U.S. Application Data

(60) Provisional application No. 60/901,639, filed on Feb. 16, 2007.

(51) Int. Cl.
*H04H 20/74* (2008.01)
*H04B 1/18* (2006.01)
*H04B 1/10* (2006.01)

(52) U.S. Cl.
USPC ............... 455/150.1; 455/3.02; 455/179.1; 455/188.1; 455/287; 455/307; 348/731

(58) Field of Classification Search
USPC ............. 455/3.02, 3.04, 150.1, 179.1–180.4, 455/184.1, 188.1–191.3, 287, 307; 348/725, 348/729, 731
See application file for complete search history.

(56) References Cited

U.S. PATENT DOCUMENTS

| | | | |
|---|---|---|---|
| 6,438,361 B1* | 8/2002 | Chong et al. | 455/188.1 |
| 6,700,624 B2* | 3/2004 | Yun | 348/555 |
| 6,842,198 B2* | 1/2005 | Suzuki et al. | 348/731 |
| 6,950,152 B2* | 9/2005 | Yamamoto | 348/731 |
| 7,142,833 B2* | 11/2006 | Hibino et al. | 455/193.1 |
| 7,701,515 B2* | 4/2010 | Gomez et al. | 348/731 |

(Continued)

FOREIGN PATENT DOCUMENTS

| EP | 1 521 379 A1 | 4/2005 |
|---|---|---|
| EP | 1 748 567 A2 | 1/2007 |

OTHER PUBLICATIONS

Sinderen et al., "A 48-860MHz Digital Cable Tuner IC with Integrated RF and IF Selectivity," IEEE International Solid-State Circuits Conference, Feb. 9-13, 2003, Session 25, RF Infotainment, Paper 25.3, IEEE (10 pages).

Fillatre et al., "A SiP Tuner with Integrated LC Tracking Filter for both Cable and Terrestrial TV Reception," IEEE International Solid-State Circuits Conference, Feb. 11-15, 2007, San Francisco, California, Session 11, TV Tuner/RFID, Paper 11.2, Digest of Technical Papers, pp. 208-209 and 597, IEEE.

European Search Report dated Aug. 27, 2009.

(Continued)

*Primary Examiner* — Simon Nguyen
(74) *Attorney, Agent, or Firm* — Sterne, Kessler, Goldstein & Fox, P.L.L.C.

(57) ABSTRACT

A tuner front-end circuit for processing a radio frequency (RF) signal includes a first filter block that terminates the RF signal for unwanted frequency bands; a second filter block that provides selectivity within the unterminated signal by separating the unterminated signal into a plurality of separate signals, each of a different desired frequency band; and an amplifier block that amplifies each of the separate signals. One or more of the amplified separate signals can be provided to a tuner. The circuit can also include a daisy chain output block that provides the amplified separate signals to one or more additional tuners. One or more tracking filter blocks can also be included to provide further selectivity to the amplified separate signals and to reject signals at specific harmonics to prevent degradation of a signal-to-noise ratio. A method of processing an RF signal is also presented.

41 Claims, 15 Drawing Sheets

U.S. PATENT DOCUMENTS

| | | |
|---|---|---|
| 7,983,638 B2 * | 7/2011 | Pugel et al. ................ 455/180.4 |
| 2005/0024544 A1 * | 2/2005 | Waight et al. ................ 348/731 |
| 2005/0070235 A1 * | 3/2005 | Matsuura ..................... 455/131 |
| 2005/0130617 A1 | 6/2005 | Burns et al. |
| 2005/0195335 A1 | 9/2005 | Gomez et al. |
| 2006/0094394 A1 * | 5/2006 | Yamamoto et al. .......... 455/333 |
| 2006/0128328 A1 * | 6/2006 | Shah ........................ 455/178.1 |

OTHER PUBLICATIONS

Abstract of EP 1 521 379 A1.
Translation of EP 1 748 567 A2.

* cited by examiner

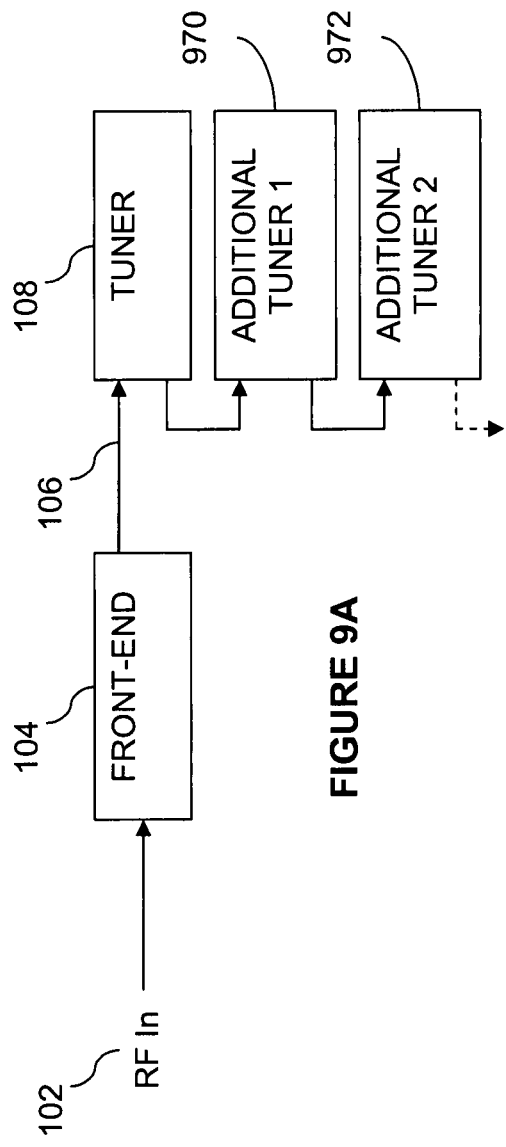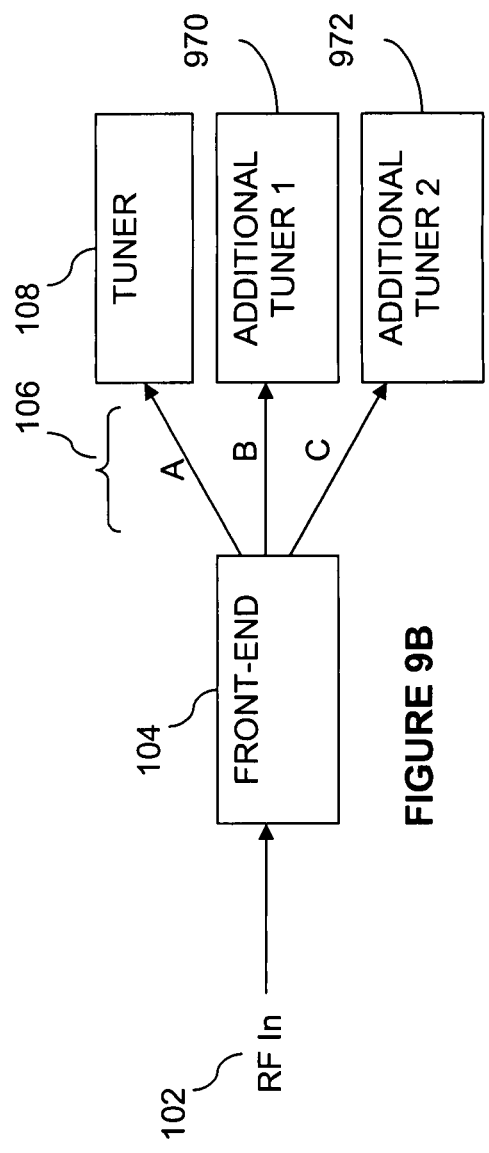

FRONT-END INTEGRATED CIRCUIT FOR TELEVISION RECEIVERS

CROSS REFERENCE TO RELATED APPLICATIONS

This application claims benefit of U.S. Provisional Patent Appl. No. 60/901,639, filed on Feb. 16, 2007, which is incorporated by reference herein in its entirety. This application is related to U.S. patent application Ser. No. 10/882,293, filed on Jul. 2, 2004, which is incorporated by reference herein in its entirety.

BACKGROUND OF THE INVENTION

1. Field of the Invention

The present invention generally relates to television receivers or tuners, and more specifically to tuner front-end signal processing.

2. Related Art

Currently, amplifiers are used in television receiver front-end circuits. However, these front-end circuits do not include any frequency selectivity. Instead, they take the entire television frequency band. This works well for cable television for which the power of all the channels is relatively even and well-controlled. However, for a terrestrial television receiver, there can be very large power differences from one channel to another channel.

In addition, existing discrete ("canned") tuners include filters that are implemented with high-quality discrete components and varactor diodes to perform the tuning. However, this does not fit with a preferred paradigm of an integrated circuit with a few non-critical external components.

Also, television receivers require very large dynamic range and have potentially strong interfering signals in the same frequency band. The large dynamic range is necessary to receive signals over a large range of input power. It is also important for television receivers to maintain a good input match to the cable or antenna impedance (typically about 75 ohms) and to change gain smoothly in response to signal level variations. A smooth change in gain avoids picture disturbances and error bursts. These requirements constrain the approaches that can be used to improve dynamic range.

Increasingly, consumer products are requiring multiple tuners connected to a single source. This permits functions such as watch-and-record (such as Digital Video Recording (DVR)), picture-in-picture, and simultaneous data/video reception, among many other functions currently available and being developed. This further constrains the receiver design. For example, filtering to eliminate unwanted distortion must be implemented in a way that does not affect reception of the interfering channel by another tuner.

What is needed is a television tuner front-end that provides high dynamic range, selectivity, and the ability to drive multiple tuners without degradation.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

Figure 6:
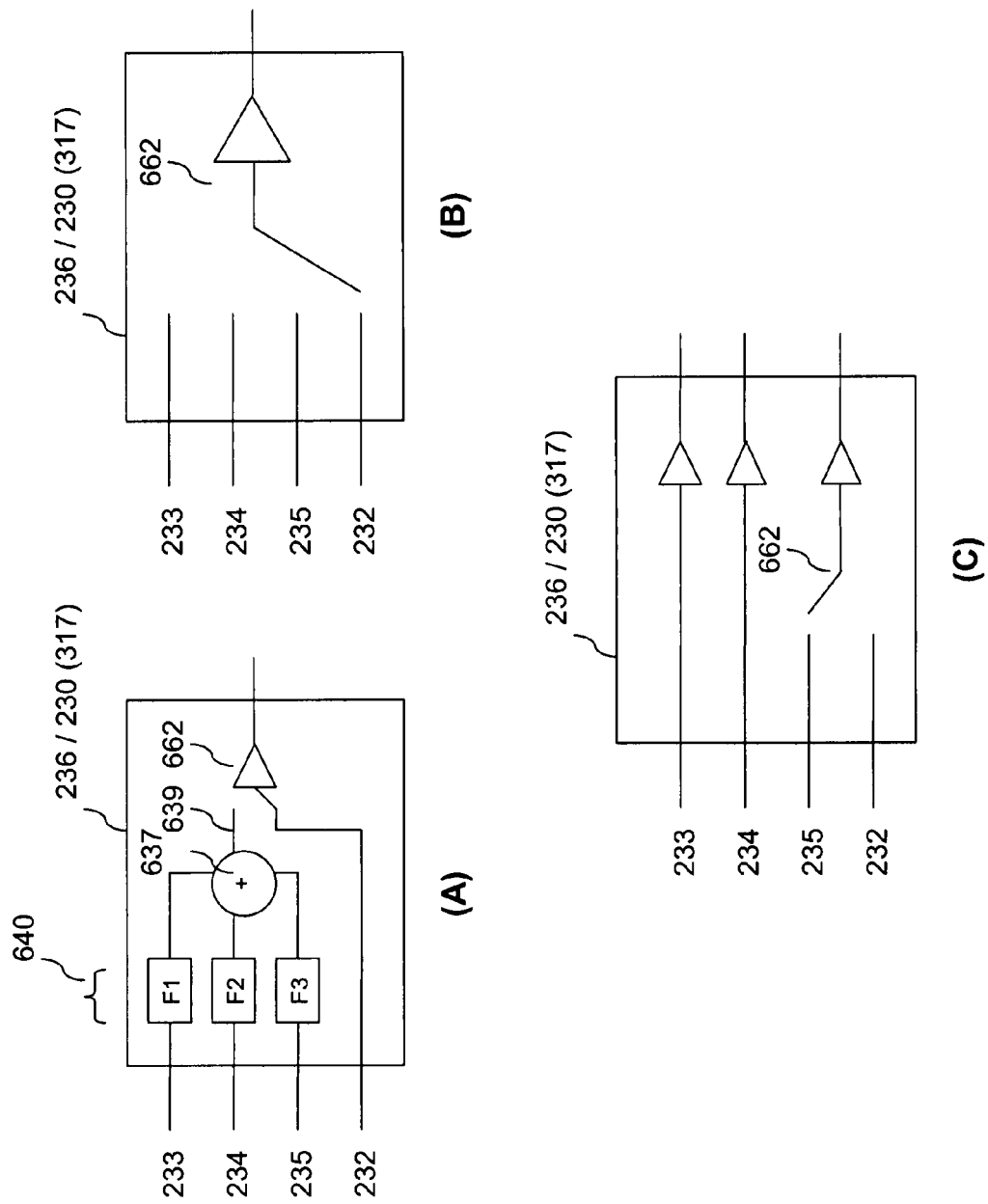

FIGS. 6A, 6B, and 6C illustrate further examples of output blocks, according to embodiments of the present invention.

Figure 7:
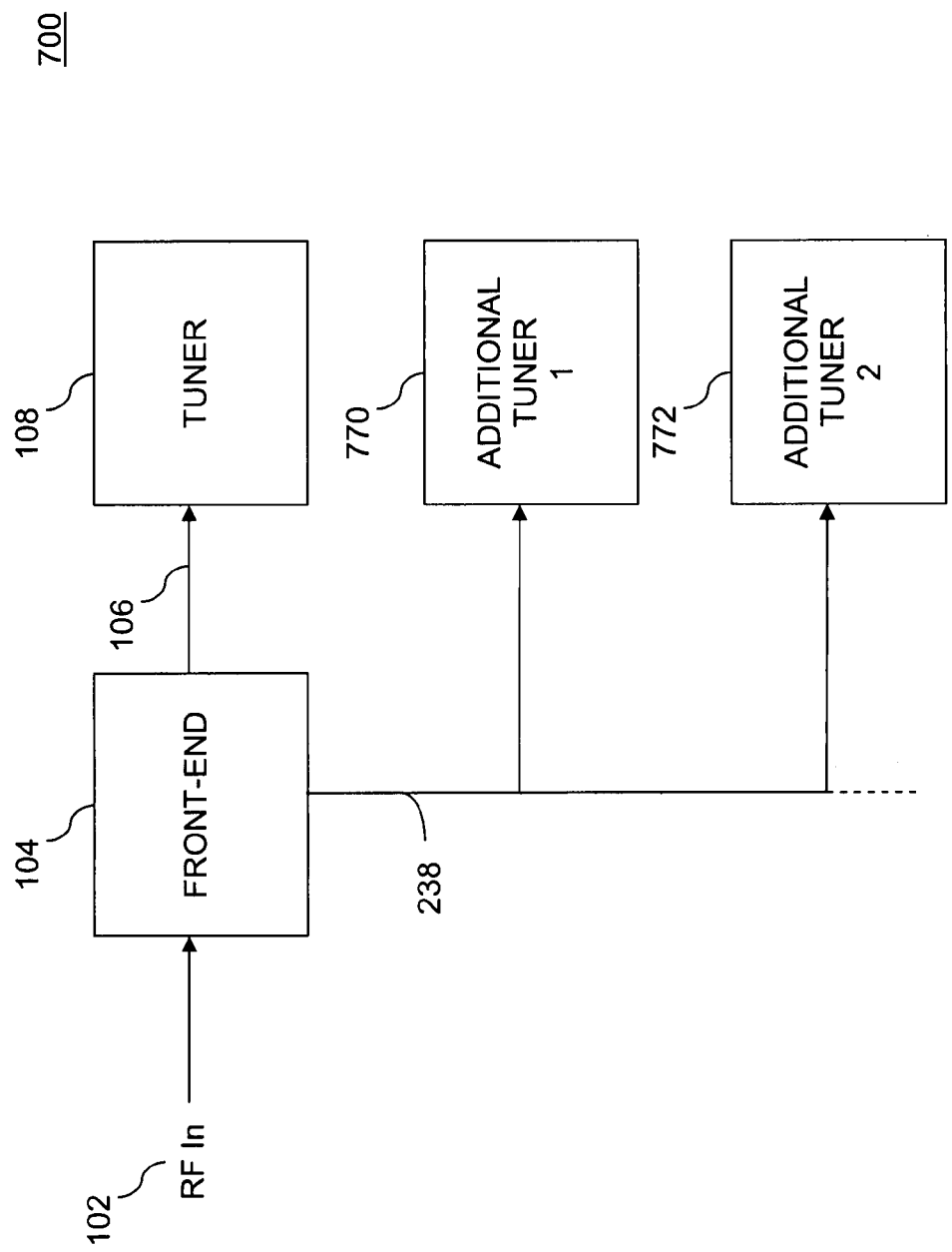

FIG. 7 is a block diagram of an example multiple tuner system having a single front-end circuit, according to an embodiment of the present invention.

Figure 8:
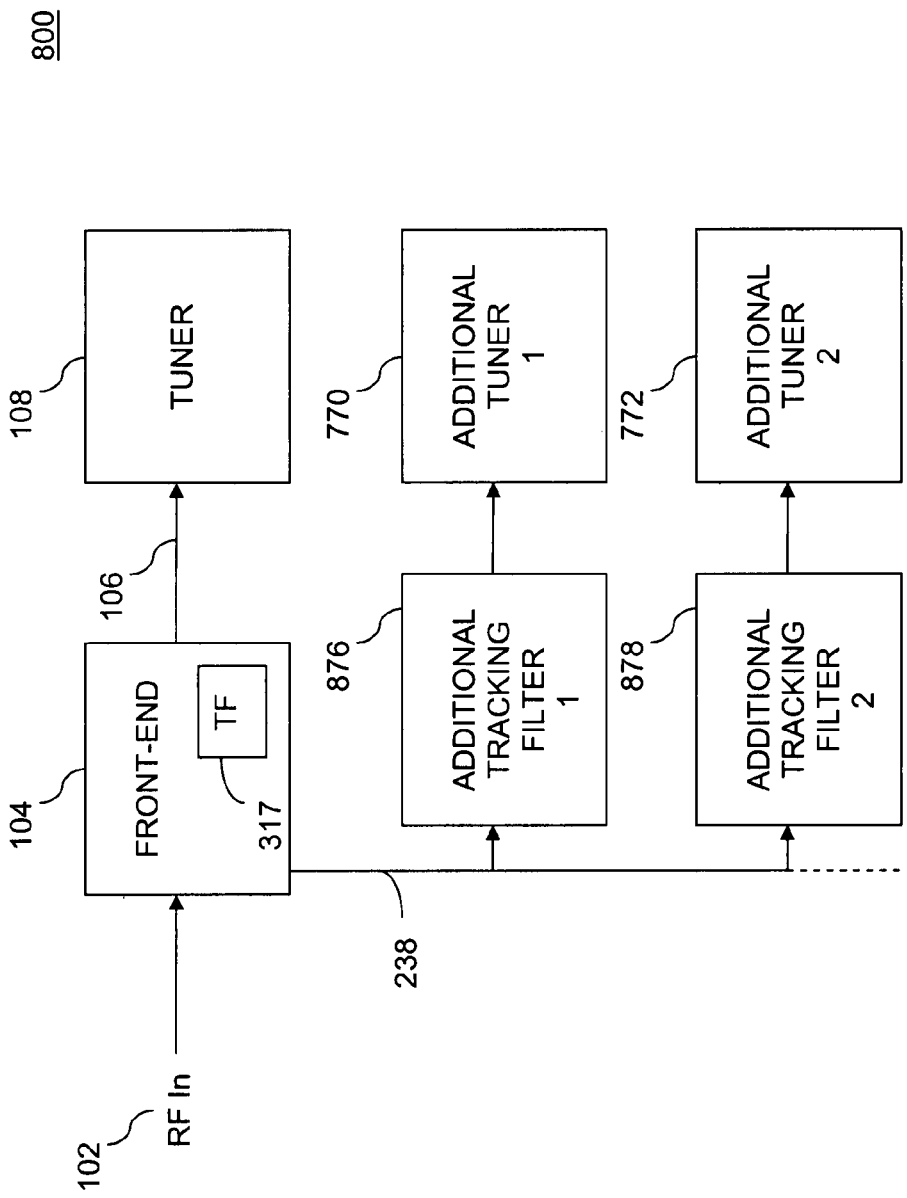

FIG. 8 is a block diagram of an example multiple tuner system having a single front-end circuit and multiple tracking filter blocks, according to an embodiment of the present invention.

FIGS. 9A and 9B illustrate further example multiple tuner systems, according to embodiments of the present invention.

Figure 10:
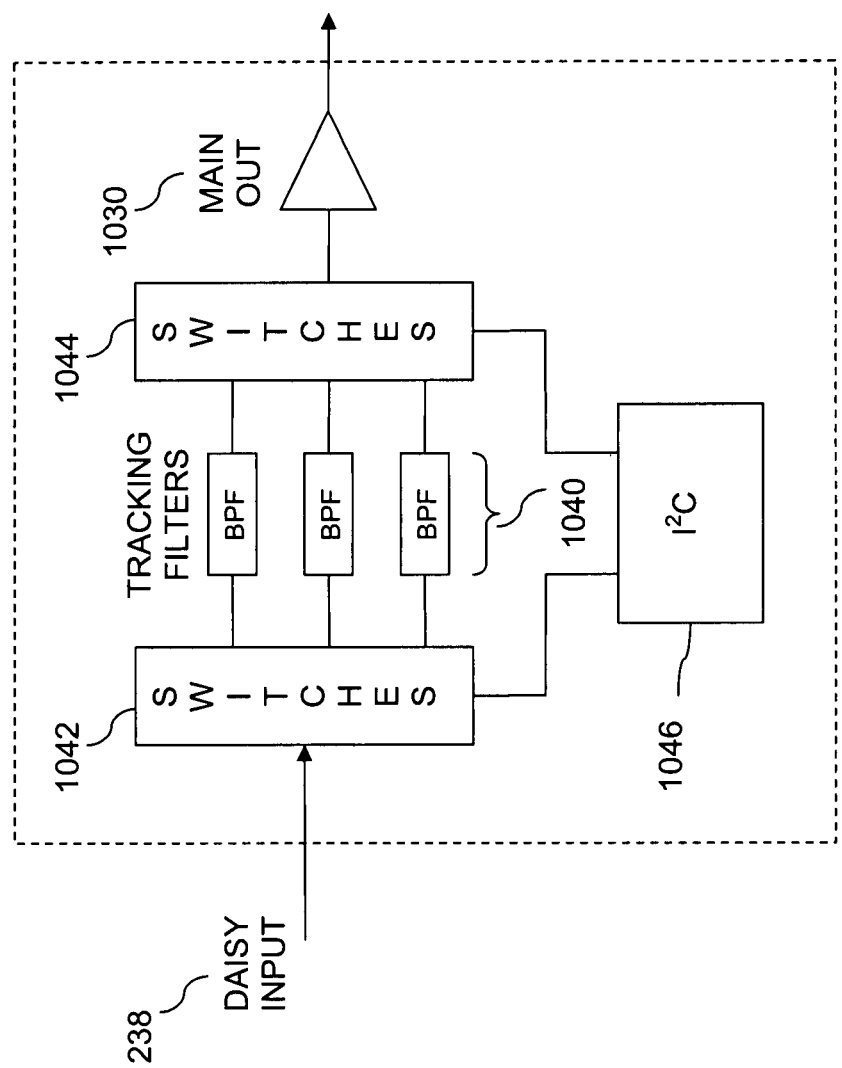

FIG. 10 illustrates a tracking filter block, according to an embodiment of the present invention.

Figure 11:
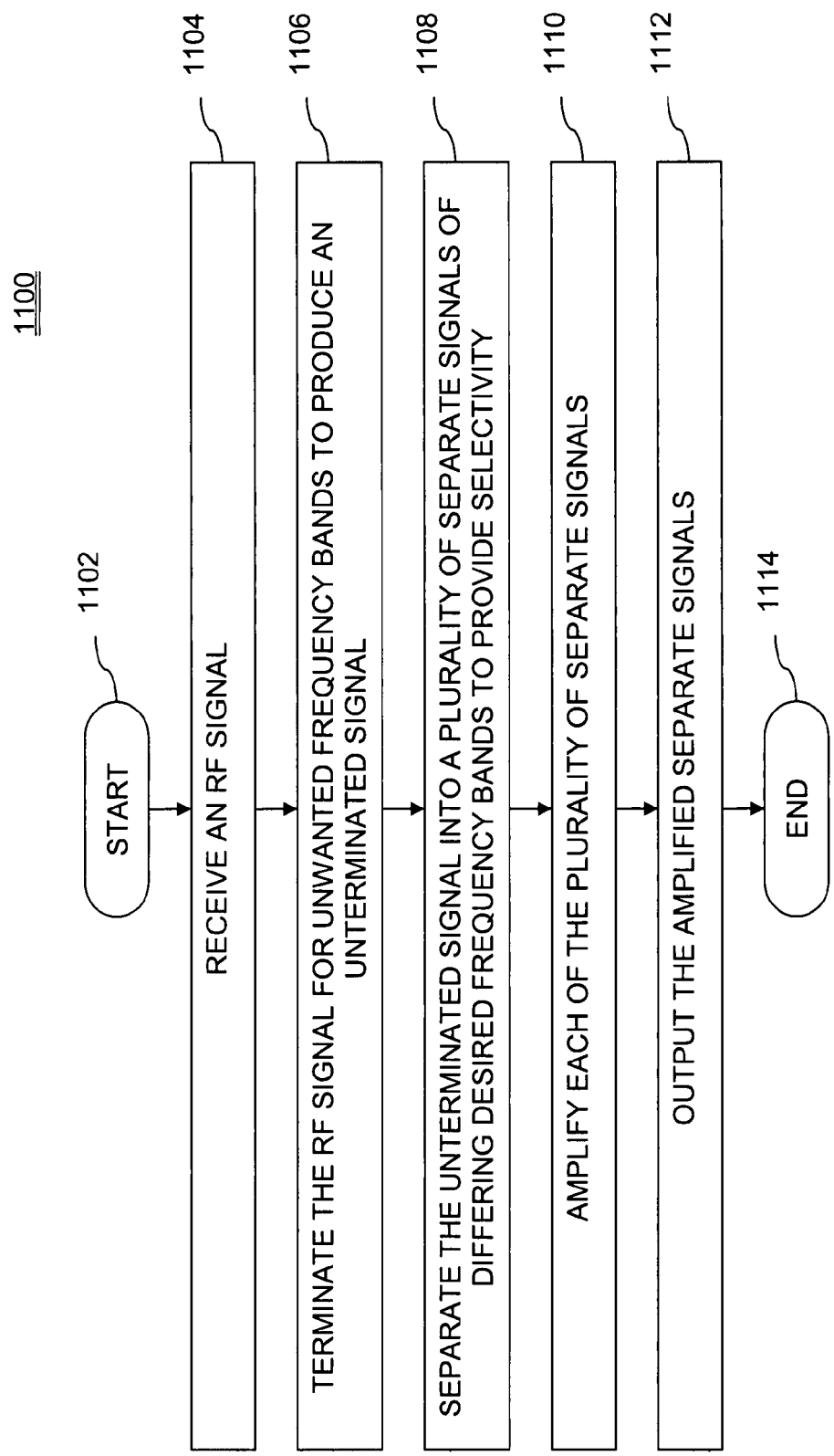

FIG. 11 is a flowchart that illustrates a method 1100 of processing a radio frequency (RF) signal, according to an embodiment of the present invention.

Figure 12:
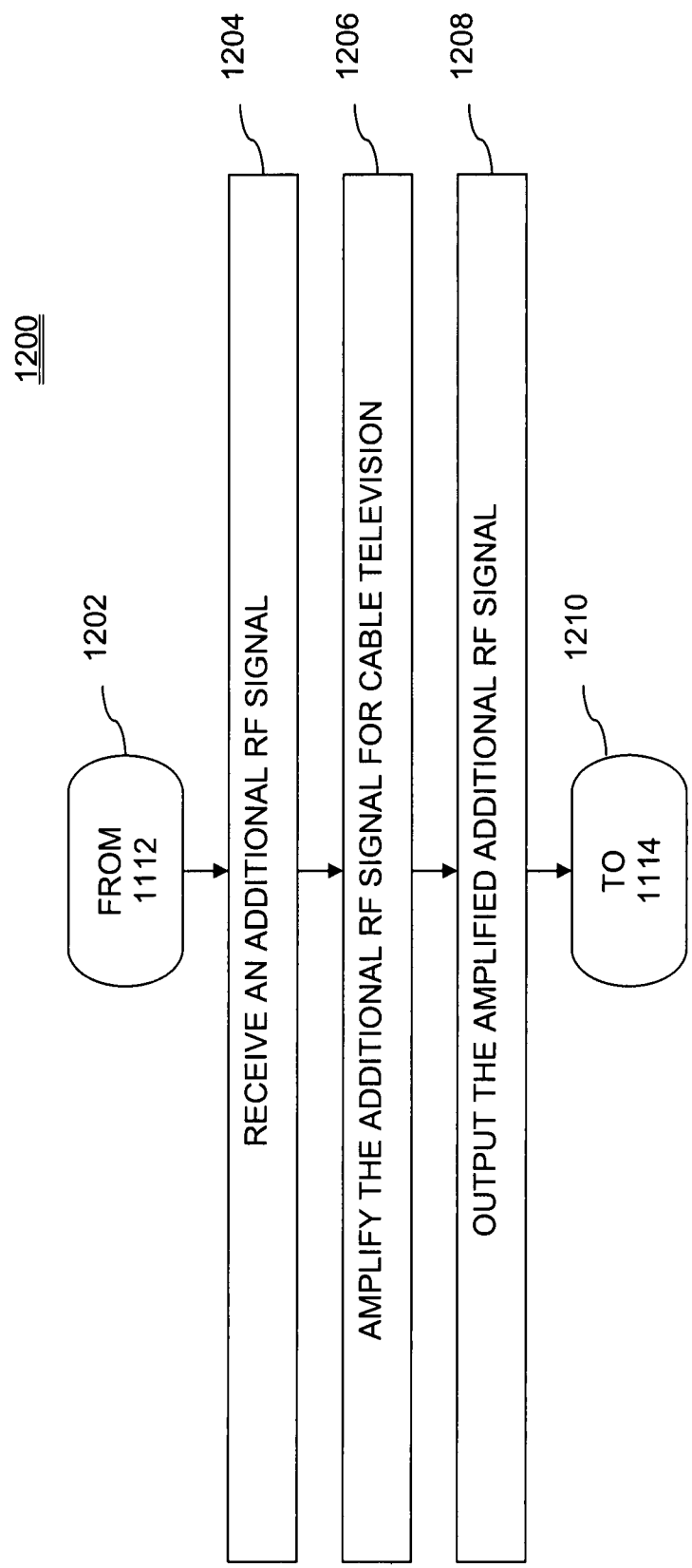

FIG. 12 is a flowchart that illustrates further steps of method 1100 with regard to a separate RF signal for cable television, according to an embodiment of the present invention.

Figure 13:
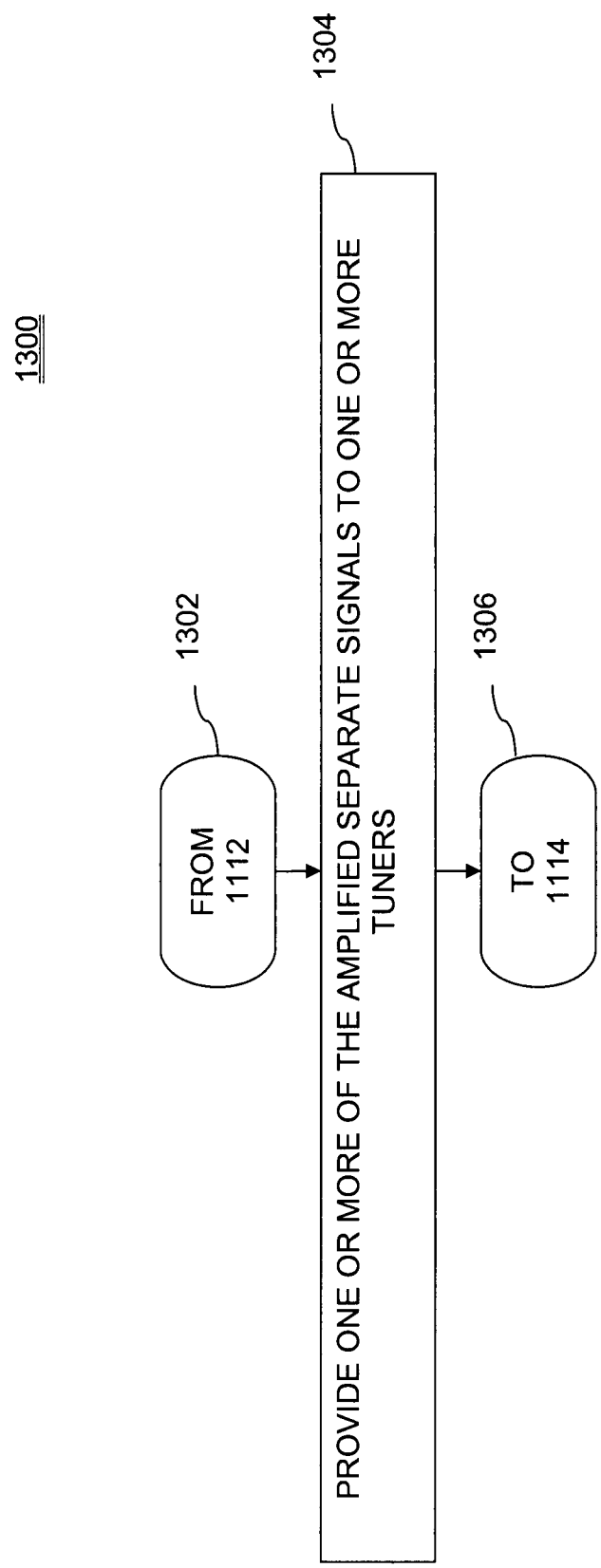
Figure 14:
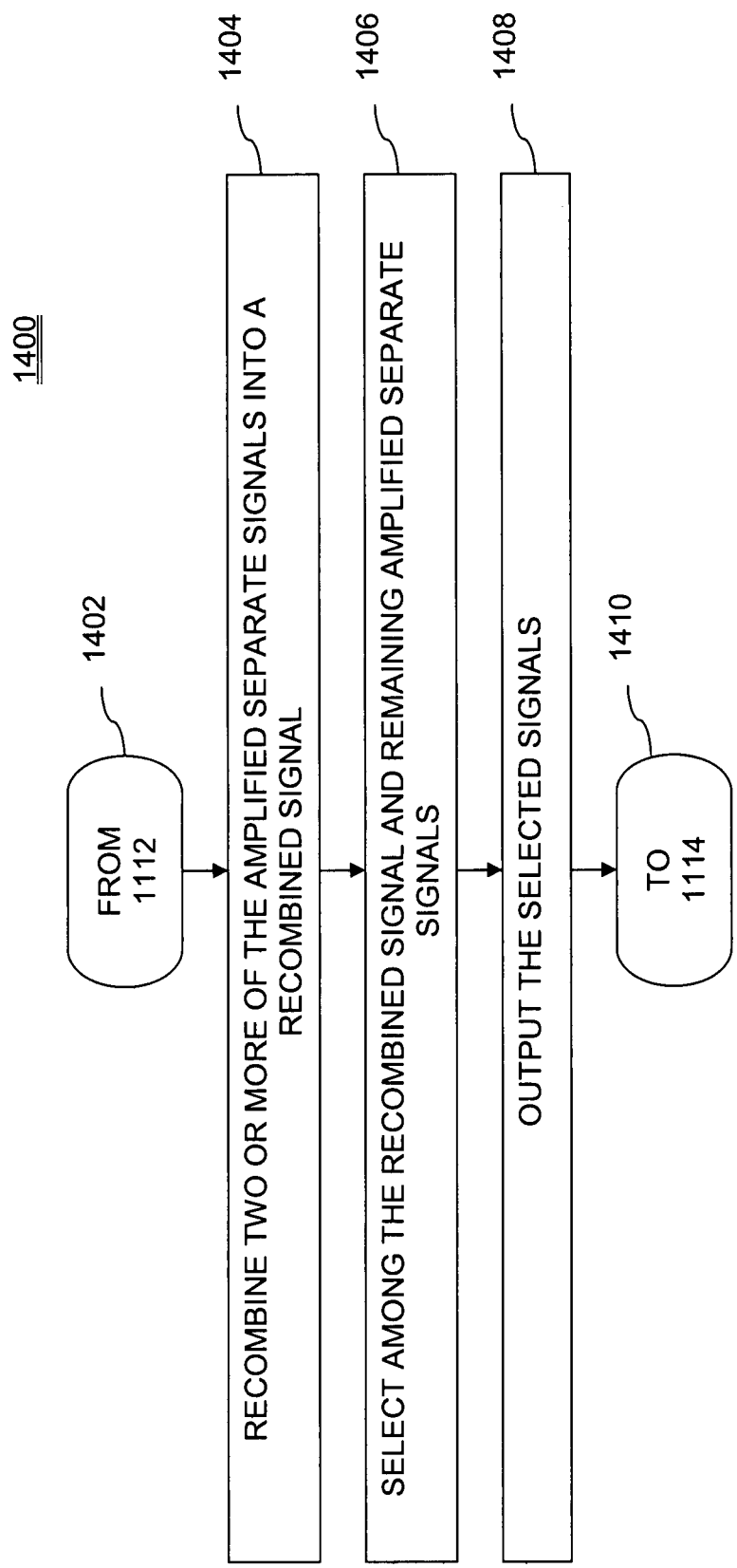

FIGS. 13 and 14 are flowcharts that illustrate further steps of method 1100 with regard to daisy-chaining, according to embodiments of the present invention.

Figure 15:
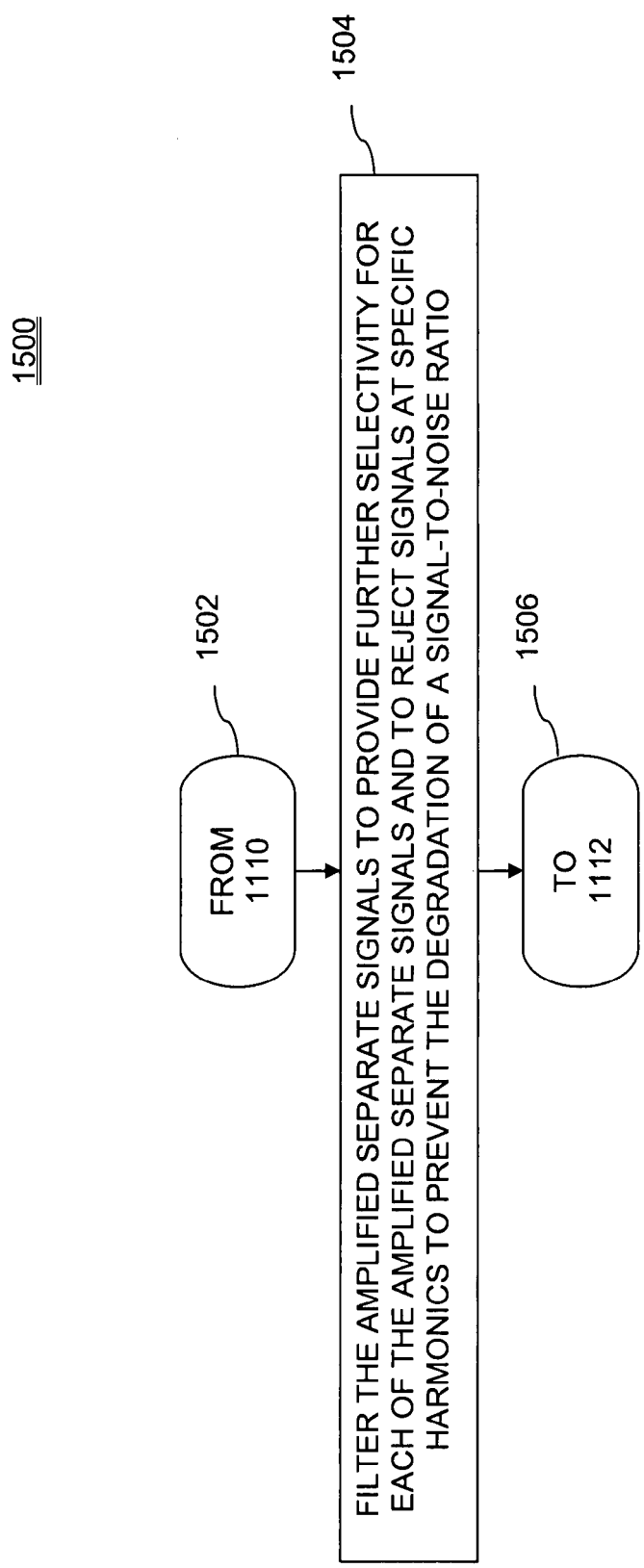
Figure 16:
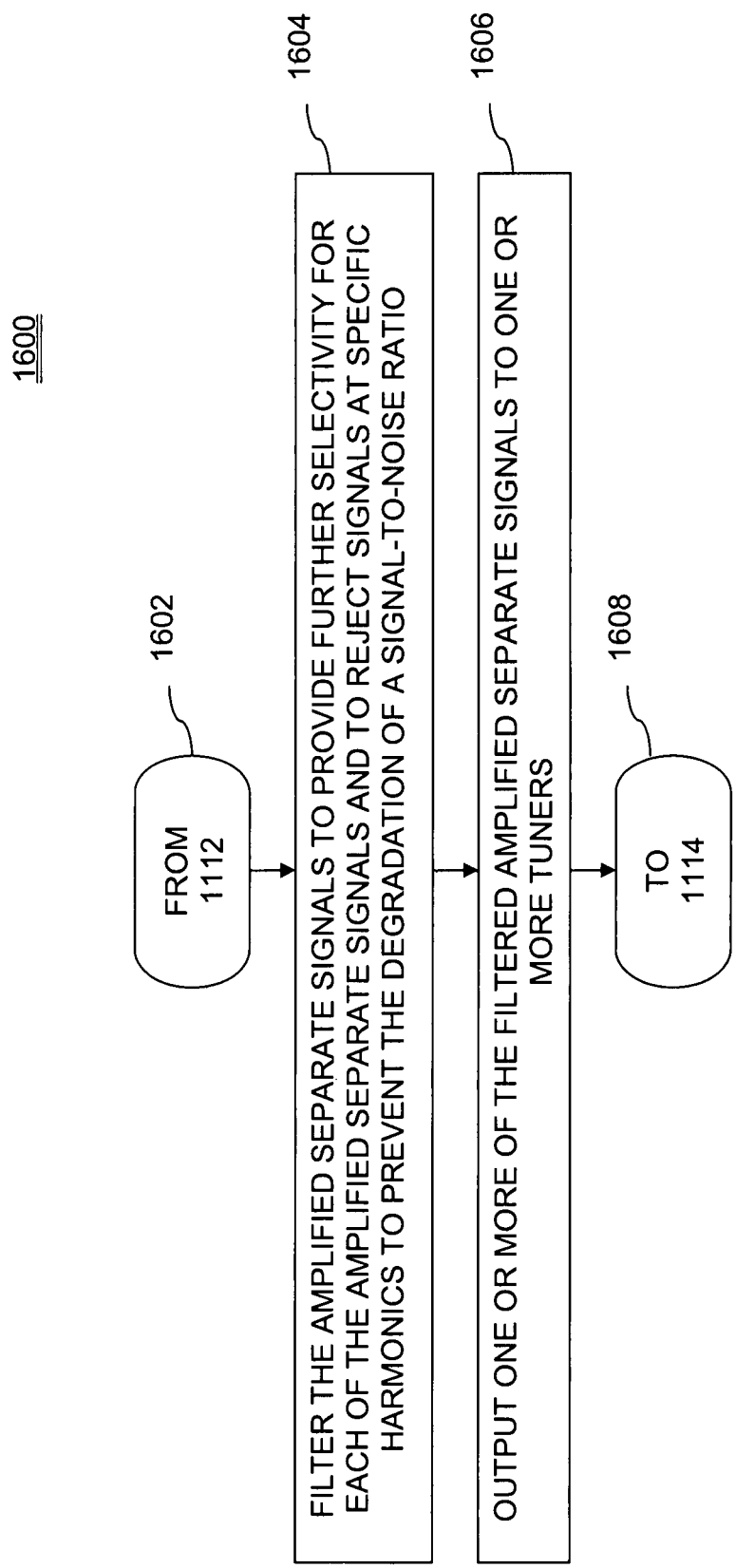

FIGS. 15 and 16 are flowcharts that illustrate further steps of method 1100 with regard to track filtering, according to embodiments of the present invention.

DETAILED DESCRIPTION OF THE INVENTION

The following describes a tuner front-end that provides high dynamic range through a design of circuit elements in an integrated circuit that have a low noise figure and a high distortion intercept point, as well as automatic gain control (AGC). In this design, dynamic range requirements are reduced by incorporating frequency selectivity to minimize interference. Frequency selectivity is provided with good termination without the use of a buffer. The selectivity provided does not include any significant frequency selective components itself but uses simple object components that allow large power differences between the channels in one frequency band and the channels in another without compromising performance.

Figure 1:
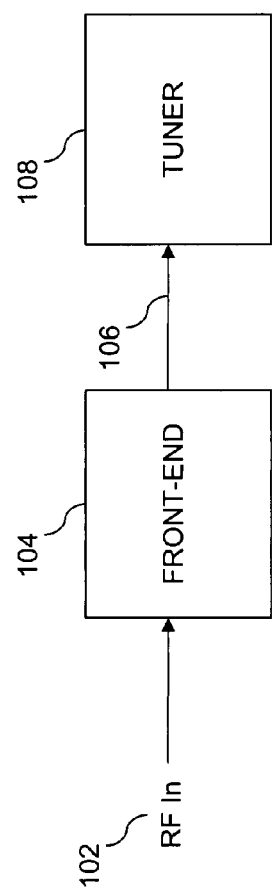
FIG. 1 is a block diagram of a tuner system including a front-end circuit, according to embodiments of the present invention.
Figure 2:
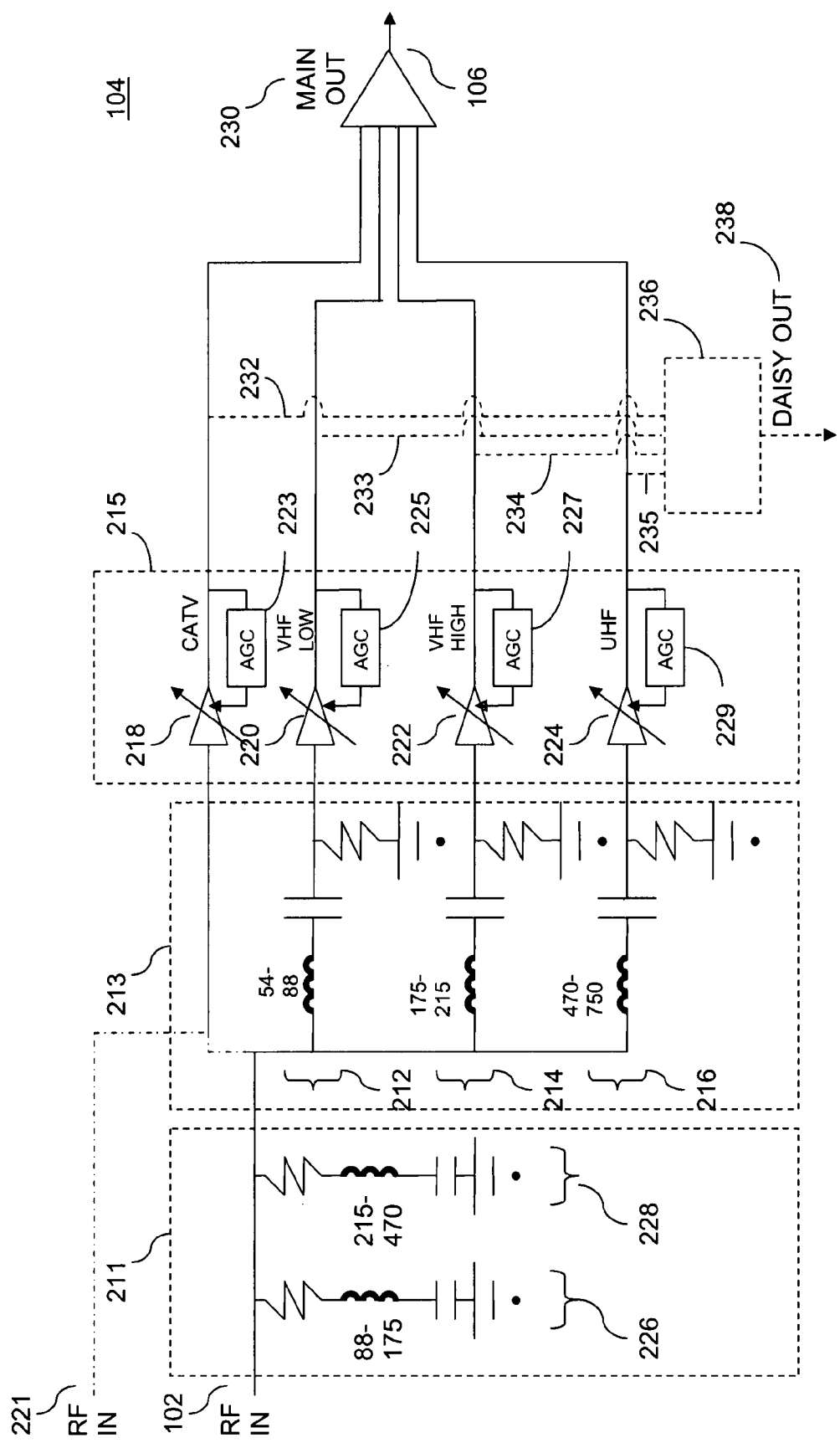
FIG. 2 illustrates a tuner front-end circuit, according to embodiments of the present invention.
Figure 3:
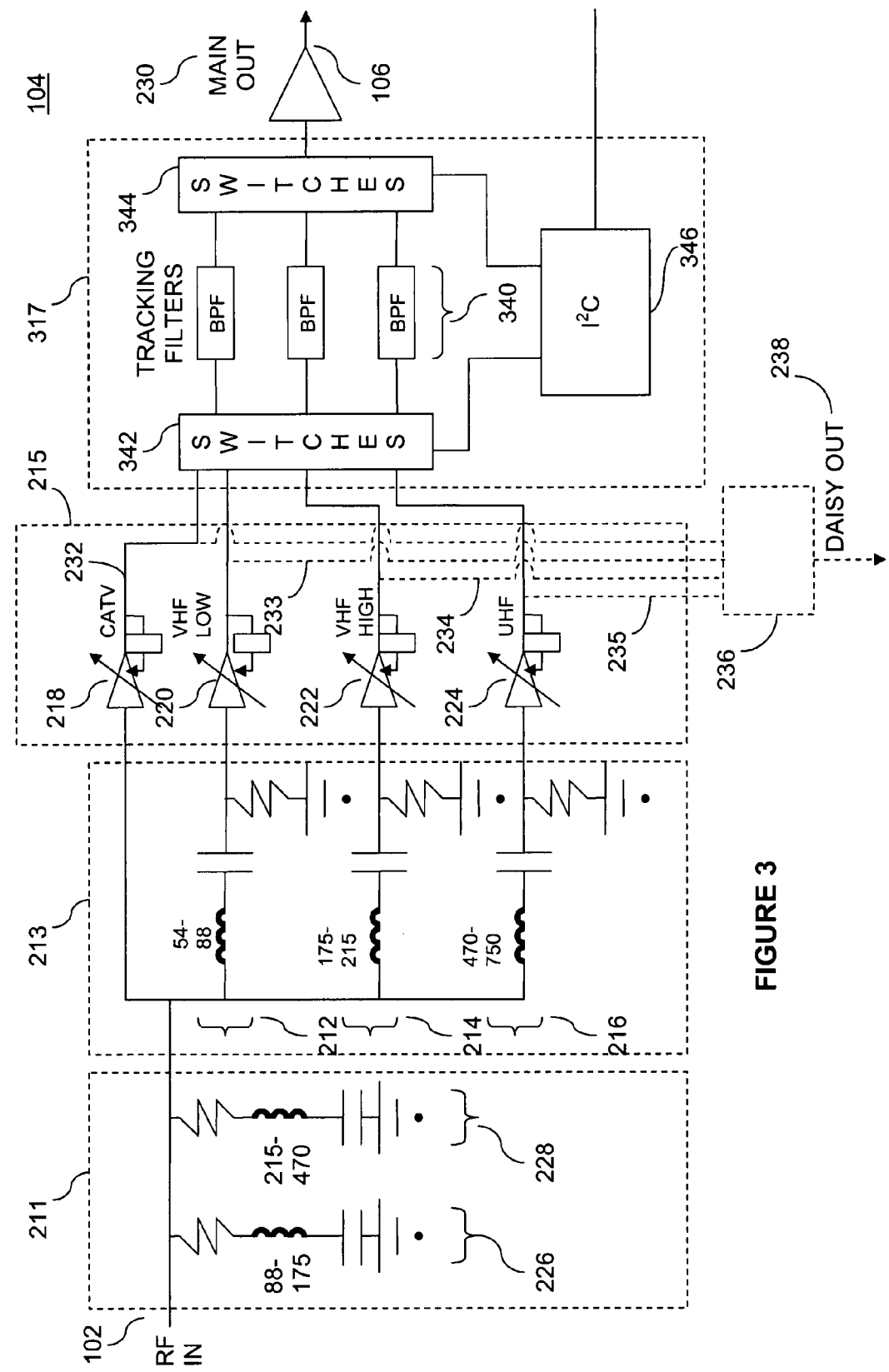
FIG. 3 illustrates a tuner front-end circuit with tracking filters, according to embodiments of the present invention.

FIG. 1 depicts a single tuner system 100 that includes a tuner front-end circuit 104 and a tuner 108. Tuner front-end circuit 104 receives and processes a signal, such as a radio frequency (RF) signal 102, and provides the processed signal 106 to tuner 108. Tuner front-end circuit 104 acts primarily as an input frequency demultiplexer that splits RF signal 102 into several frequency bands. The frequency bands can correspond, for example, to non-contiguous broadcast transmission bands. FIGS. 2 and 3 depict configurations of tuner front-end circuit 104, according to embodiments of the present invention.

The tuner-front-end circuit 104 shown in FIG. 2 includes a first filter block 211, a second filter block 213, an amplifier block 215, and a main output 230. A description of each follows.

First filter block 211 includes parallel frequency selective terminating circuits that terminate RF signal 102 for particular frequency bands (i.e., they fill in the gaps between frequency bands). Two parallel frequency selective terminating circuits (226/228) are shown in FIG. 2. However, any number of parallel frequency selective terminating circuits can be implemented. In the specific embodiment shown, frequency selective terminating circuit 226 terminates RF signal 102 for frequencies in the range 88-175 MHz and frequency selective terminating circuit 228 terminates RF signal 102 for frequencies in the range 215-470 so as to prevent signals in the mentioned frequency ranges from reaching the following stage 213. Each of the frequency selective terminating circuits is grounded and includes a resistor, an inductor, and a capacitor, in series. The inductor and capacitor are configured to provide a bandpass filter for the mentioned frequency ranges so that they are filtered out, and the resistor terminates the RF signal so as to provide a proper impedance match. The terminating resistor provides approximately 75 ohms of resistance. In operation, first filter block 211 receives RF input signal 102, terminates RF signal 102 for particular frequency bands (e.g. 88-175 MHz, 215-470 MHz), and provides the remaining frequency bands of RF signal 102 to second filter block 213. Accordingly, the frequency selective terminating circuits are designed to operate as band-stop circuits for the mentioned frequency ranges and pass all other frequencies with a good impedance match.

Second filter block 213 includes one or more series resonant circuits that split the unterminated RF signal 102 received from first filter block 211 into separate bands of desired frequencies prior to providing the separated signals to amplifier block 215. The series resonant circuits are parallel to each other and each includes an inductor, a capacitor, and a grounded resistor. The inductor and capacitor are in series and provide a bandpass filter. The grounded resistor provides signal termination. Three series resonant circuits (212/214/216) are shown in FIG. 2, and can be described as bandpass filters 212, 214, and 216. However, any number of series resonant circuits can be implemented. In the specific embodiment shown, series resonant circuit 212 filters to provide a signal with frequencies in the range 54-88 MHz, series resonant circuit 214 filters to provide a signal with frequencies in the range 175-215 MHz, and series resonant circuit 216 filters to provide a signal with frequencies in the range 470-750 MHz. In other words, the three series resonant circuits shown (212/214/216) split unterminated RF signal 102 received from first filter block 211 into signals with frequency bands that correspond to the non-contiguous broadcast transmission bands currently designated in the United States as VHF-Low, VHF-High, and UHF, respectively. These signals are called terrestrial signals.

In one embodiment, unterminated RF signal 102 received from first filter block 211 can also be allowed to bypass the separating that occurs in second filter block 213 and instead be provided directly to amplifier block 215. This unseparated signal can be used for cable television, where there are typically no frequency gaps in the received spectrum. In an alternative embodiment, the cable television signal can be a separate RF input signal, such as RF input signal 221, which may cover the entire television band of frequencies. In this embodiment, RF input signal 221 can be provided directly to amplifier block 215. In a further embodiment, a switch can be provided (not shown) to allow selection between a single RF input signal for both terrestrial and cable signals and a separate RF input signal for cable television.

Amplifier block 215 can include low-noise, high impedance amplifiers (LNAs) that each amplify one of the separated signals output from second filter block 213. In other words, each frequency band is amplified separately. Amplifier block 215 can also include an amplifier to amplify the signal designated for cable television. Each amplifier has its own automatic gain control (AGC) loop. The gain control is based on the total power in a particular frequency band. The AGC loops ensure that signals received by the amplifiers are amplified to substantially even power levels. In the specific embodiment shown, amplifier block 215 contains four amplifiers 218/220/222/224 to amplify the cable television signal, the VHF-Low signal, the VHF-High signal, and the UHF signal, respectively. Each amplifier 218/220/222/224 has a corresponding AGC loop 223/225/227/229. The amplified signals are passed to main output 230 to be provided to tuner 108 as signal(s) 106.

As just stated, the AGC loops 223/225/227/229 will ensure that the demultiplexed broadcast signals are amplified to comparable power levels. They then can be combined into a signal that is relatively even in power across all bands, and that signal can be processed further with reduced dynamic range in subsequent circuits. In other words, the input power for each frequency band is adjusted to a preset power level. The result is that, for example, a very strong signal in the VHF-Low band, for example, will not interfere as strongly with a signal in the UHF band. This is advantageous in that the leveled amplified signals can be provided to additional tuners or additional front-end circuits that serve additional tuners, as will be discussed below and further in this document.

In an embodiment, the amplified signals are provided to additional tuners via a daisy chain output block 236. Daisy chain output block 236 receives cable television signal 232 and terrestrial signals 233/234/235 and outputs one or more of the signals as daisy output 238. In one embodiment, two or more of terrestrial signals 233/234/235 are recombined into one signal. In an alternative embodiment, terrestrial signals 233/234/235 remain separate signals. Daisy chain output block 236 will be further described later in the document with reference to FIGS. 4, 5, and 6.

FIG. 3 depicts an embodiment of tuner front-end circuit 104 that includes track filtering. In this embodiment, after amplification, the amplified signals are provided to a tracking filter block 317 for further processing prior to being provided to main output 230. Specifically, tracking filter block 317 provides further selectivity to the amplified signals, and rejects signals at specific harmonics to prevent the degradation of a signal-to-noise ratio. As will be described in following sections, the tracking filters are configured to remove RF energy from the RF signal 102 that resides at harmonics of the mixer LO in one or more corresponding tuners. Tracking filter block 317 includes tracking filters 340, a first set of switches 342, a second set of switches 344, and an inter-integrated circuit 346 to control the first and second sets of switches (342/344). The first set of switches 342 receives the amplified signals and provides either the cable television signal 232 or one of the terrestrial signals to a corresponding bandpass filter 340. The second set of switches 344 determines which of the outputs of the bandpass filters 340 to provide to main output 230 in order to avoid any additional noise floors from the unused bandpass filters.

Figure 5:
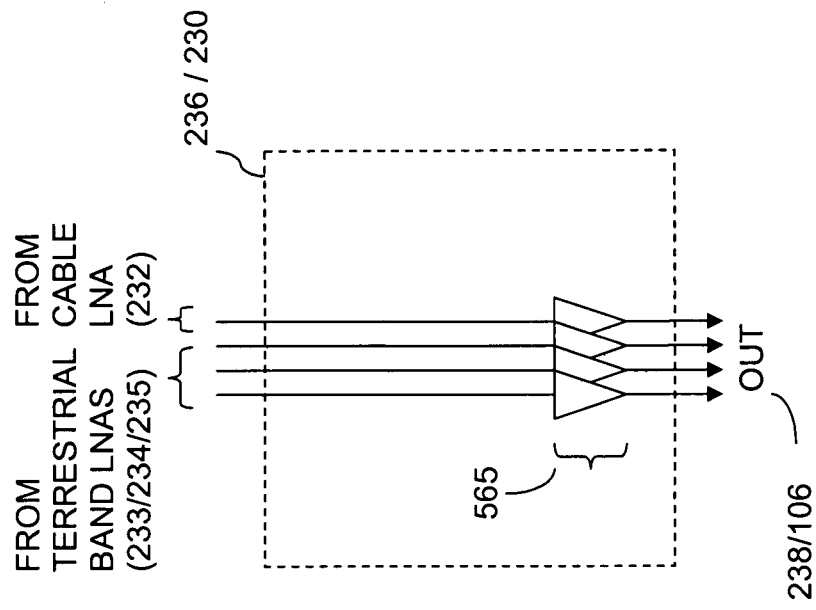
FIGS. 4 and 5 illustrate examples of daisy chain output blocks, according to embodiments of the present invention.
Figure 4:
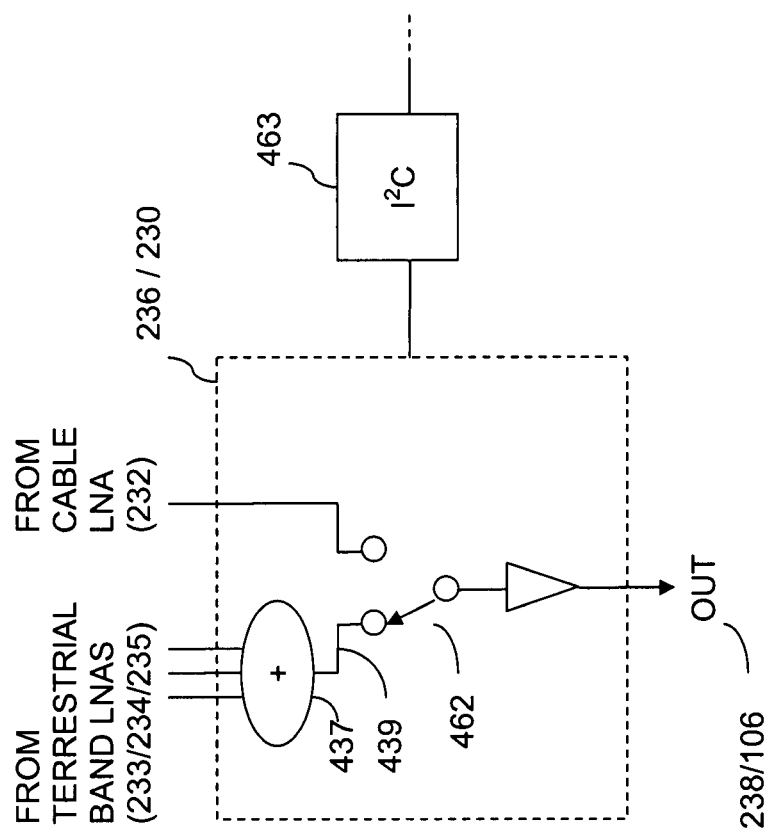

FIGS. 4 and 5 depict example configurations of daisy chain output block 236 found in FIGS. 2 and 3, according to embodiments of the present invention. As would be appreciated by those skilled in the relevant art(s), FIGS. 4 and 5 can also represent main output 230. FIG. 4 depicts output block 236/230 as a switch/amplifier 462 that selects between cable television signal 232 and a recombined terrestrial signal 439. Recombined terrestrial signal 439 includes the outputs of amplifiers 220, 222, and 224 (that correspond to the VHF-High, VHF-Low, and UHF terrestrial signals), which have been recombined by combiner 437 into one signal 439. Switch/amplifier 462 can be controlled by an inter-integrated circuit 463. In the embodiment shown in FIG. 3, switch/amplifier 462 can be controlled by inter-integrated circuit 346. The selected signal is output as output 238/106.

FIG. 5 depicts output block 236/230 as a set of amplifiers 565 that each receive and pass a corresponding one of the amplified signals as output 238/106. In the specific configuration shown, there are four amplifiers in the set of amplifiers 565, one that corresponds to the cable television signal 232, one that corresponds to the VHF-Low terrestrial signal 233, one that corresponds to the VHF-High terrestrial signal 234, and one that corresponds to the UHF terrestrial signal 235. The advantage of this is that it maintains the highest selectivity for the cascaded tuners. This configuration can be considered a higher performance implementation than the implementation that uses switch/amplifier 462 to select between a recombined signal and a cable television signal. A disadvantage is that it may require additional output pins if a daisy cascade is implemented across multiple integrated circuits. However, if the daisy chain is implemented on a single integrated circuit, this arrangement may be preferable.

FIGS. 6A, 6B, and 6C illustrate further examples of daisy chain output block 236 or main output 230, or a combination of outputs 230/236 and tracking filter block 317, according to embodiments of the present invention.

FIG. 6A illustrates terrestrial signals 233/234/235 entering output 236/230 and being filtered by filters 640 prior to being recombined at combiner 637 as recombined signal 639. Filters 640 can be equivalent to tracking filters 340 of FIG. 3. Amplifier/switch 662 selects between recombined signal 639 and cable signal 232 and outputs the selected signal. This output configuration represents a leveled output with full frequency band.

FIG. 6B illustrates terrestrial signals 233/234/235 and cable signal 232 entering output 236/230. Amplifier/switch 662 selects one of the signals and outputs the selected signal. This output configuration outputs a single frequency band.

In FIG. 6C, terrestrial signals 233/234/235 and cable signal 232 enter output 236/230. Amplifier/switch 662 selects between a terrestrial signal (e.g., terrestrial signal 235) and cable signal 232, and outputs the selected signal along with the remaining terrestrial signals (e.g., 233/234). This output configuration outputs multiple frequency bands. In each of FIGS. 6A/6B/6C, amplifier/switch 662 can be controlled by an inter-integrated circuit ($I^2C$) (not shown).

The output examples shown in FIGS. 4, 5, and 6A-C represent only a few examples of possible output configurations. One skilled in the relevant art(s) would appreciate, after reviewing this disclosure, that there are many output configurations that fit within the scope of the present invention.

FIG. 7 is a block diagram showing an example of a multiple-tuner system 700. Multiple-tuner system 700 includes tuner front-end circuit 104 and tuner 108, as well as one or more additional tuners. In FIG. 7, there are two additional tuners (770/772) shown. However, system 700 can be implemented with any number of additional tuners. As can be seen in the example shown in FIG. 7, daisy chain output 238 is provided to the additional tuners.

FIG. 8 is a block diagram showing another example of a multiple-tuner system 800. Multiple-tuner system 800 is similar to multiple-tuner system 700, except that tracking filter blocks (e.g., 876/878) are used as front-end circuits to the additional tuners. In this example system, daisy chain output 238 is provided to tracking filter blocks 876/878 for processing prior to being provided to corresponding additional tuners 770/772. The tracking filters are controlled by downstream circuits that select the desired RF frequency. In this system, it is preferred that the daisy chain output block 236 used in tuner front-end circuit 104 be the daisy chain output block 236 shown in FIG. 5, because all of the signals, including the terrestrial signals, remain as separate signals.

The multiple-tuner system examples shown in FIGS. 7 and 8 represent only a few examples of possible configurations. One skilled in the relevant art(s) would appreciate, after reviewing this disclosure, that there are many output configurations that fit within the scope of the present invention. For example, the daisy chaining of multiple tuners could stem from tuner 108 as shown in FIG. 9A. In this example, tuner 108 provides one or more signals 106 to additional tuner 970, and additional tuner 970 provides one or more signals 106 to additional tuner 972, etc. In the example shown in FIG. 9B, signals 106A, 106B, and 106C are provided to tuners 108, 970, and 972, respectively, directly from front-end circuit 104.

FIG. 10 depicts the circuitry of tracking filter blocks 876/878, according to an embodiment of the present invention. Tracking filter blocks 876/878 include tracking filters 1040, a first set of switches 1042, a second set of switches 1044, an inter-integrated circuit 1046 to control the first and second sets of switches (1042/1044), and a main output 1030. The first set of switches 1042 receives the amplified signals (e.g., from daisy chain output 238) and provides either the cable television signal or one of the terrestrial signals to a corresponding bandpass filter 1040. The second set of switches 1044 determines which of the outputs of the bandpass filters 1040 to provide to main output 1030 in order to avoid any additional noise floors from the unused bandpass filters. A resulting signal 1006 is provided to the corresponding additional tuner 770/772 from main output 1030. Similar to the tracking filter depicted in tuner front-end circuit 104 in FIG. 3, tracking filter blocks 876/878 provide further selectivity to the amplified signals, and rejects signals at specific harmonics to prevent the degradation of a signal-to-noise ratio.

As just stated, tracking filters can provide additional selectivity for downstream tuner circuits, having the advantage of reducing their dynamic range. The tracking filters provide a tunable filter for each frequency band. Additionally, the tracking filters reject the RF signals at harmonics of a mixer local oscillator (LO) if a downstream tuner is a direct-conversion (zero-IF) or low-IF single-conversion tuner. Realistic mixers in direct-conversion or single-conversion tuners mix the RF signal not only with the LO, but also with harmonics of the LO. If there is significant interfering RF power at these frequencies, the interfering signal will be mixed to the same IF frequency band as the desired signal. This will degrade the signal-to-noise ratio (SNR). Using the tracking filters can prevent this degradation. Accordingly, the tracking filters 317/876/878 are configured as low pass or bandpass filters having passbands designed to remove any signal energy in the RF signal 102 that resides at harmonics of the mixer LO in the corresponding tuners 108/770/772. The tracking filters can be located external to their corresponding tuners as shown in FIGS. 3 and 8, or alternatively, they can be located within the tuners themselves (not shown).

In the embodiments described above (and below), the tuner front-end circuit, the tracking filters and the tuners can be implemented on one or over several integrated circuits, as would be understood by those skilled in the relevant art(s). The invention can be implemented with full integration. However, the nature of discrete components is that they will have better quality and lower cost if they are either on a PC board or in a hybrid.

FIG. 11 is a flowchart describing a method 1100 of processing an RF signal, according to an embodiment of the present invention. Method 1100 starts at step 1102. In step 1104, an RF signal is received. For example, an RF signal 102 is received by first filter block 211 shown in FIGS. 2 and 3. In step 1106, particular frequency bands are terminated from the RF signal, producing an unterminated signal. Referring again to FIGS. 2 and 3, step 1106 is carried out in first filter block 211. In step 1108, the unterminated signal is separated into a plurality of separate signals of differing desired frequency bands, providing frequency selectivity. Second filter block 213 of FIGS. 2 and 3 provides this separation of frequency bands. In step 1110, each of the separate signals is amplified. This occurs in amplifier block 215 of FIGS. 2 and 3. In an embodiment, this amplification is performed by high impedance, low-noise amplifiers that each have an AGC loop to ensure that signals received are amplified to substantially even power levels. In step 1112, the amplified separate signals are output. This occurs through main output 230 shown in FIGS. 2 and 3, for example. From main output 230, the amplified separate signals can be provided to a tuner, such as tuner 108. Method 1100 ends at step 1114.

FIG. 12 is a flowchart describing a method 1200, which is a method in furtherance of method 1100, with a separate RF signal for cable television, according to an embodiment of the present invention. Method 1200 begins at step 1202, which stems from step 1112 of FIG. 11. In step 1204, an additional RF signal is received. It can be received at first filter block 211, second filter block 213, or amplifier block 215 of FIGS. 2 and 3, for example, but no processing takes place on the additional RF signal until it reaches amplifier block 215. In step 1206, the additional RF signal is amplified (by amplifier 218 of FIGS. 2 and 3, for example). In step 1208, the amplified additional RF signal is output (via main output 230, for example). The amplified separate signals can then be provided to a tuner, such as tuner 108. Method 1200 returns to step 1114 of method 1100 at step 1210. In method 1200, the additional RF signal is not filtered or separated into any specific frequency band(s). This is ideal for cable television in which there are typically no frequency gaps in the received spectrum.

FIG. 13 is a flowchart describing a method 1300, which is a further embodiment stemming from method 1100. Method 1300 begins at step 1302, which stems from step 1112 of FIG. 11. In step 1304, one or more of the amplified separate signals are provided to one or more tuners. For example, one or more of the amplified separate signals can be provided to tuner 108 through main output 230. In addition, one or more of the amplified separate signals can be provided to one or more additional tuners. This can occur via daisy chain output block 236 of FIGS. 2 and 3, for example. Method 1300 returns to step 1114 of method 1100 at step 1306.

FIG. 14 is a flowchart describing a method 1400, which is another embodiment stemming from method 1100. Method 1400 begins at step 1402, which stems from step 1112 of FIG. 11. In step 1404, two or more of the amplified separate signals are recombined into a recombined signal. In step 1406, a selection is made among the recombined signal and remaining amplified separate signals. This can occur in daisy chain output block 236 of FIGS. 2 and 3, for example. For instance, switch 462 of FIG. 4 can be used to select between recombined signal 439 (including all of the terrestrial signals, for example) and cable television signal 232. In step 1408, the selected signals are output. For example, the selected signals can be provided to one or more additional tuners. Method 1400 returns to step 1114 of method 1100 in step 1410.

FIG. 15 is a flowchart describing a method 1500, which is another embodiment stemming from method 1100. Method 1500 begins at step 1502, which stems from step 1110 of FIG. 11. In step 1504, the amplified separate signals are filtered to provide further selectivity for each of the amplified separate signals and to reject signals at specific harmonics to prevent the degradation of a signal-to-noise ratio. This can occur in tracking filter block 317 of FIG. 3, for example. One or more of the resulting signals can then be provided to a tuner, such as tuner 108, via main output 230. Method 1500 returns to step 1112 of method 1100 in step 1506.

FIG. 16 is a flowchart describing a method 1600, which is yet another embodiment stemming from method 1100. Method 1600 begins at step 1602, which stems from step 1112 of FIG. 11. In step 1604, the amplified separate signals are filtered to provide further selectivity for each of the amplified separate signals and to reject signals at specific harmonics to prevent the degradation of a signal-to-noise ratio. This can occur in additional tracking filter blocks 876/878 of FIG. 8, for example. In step 1606, one or more of the filtered amplified separate signals are output, for example, to one or more additional tuners (such as additional tuners 770/772 of FIG. 8). Method 1600 returns to step 1114 of method 1100 in step 1608.

This invention relating to tuner front-end circuits has been described herein as single-ended for ease of discussion. However, the invention is not to be limited to single-ended implementations. Differential versions of the present invention can also be implemented, as will be understood by those skilled in the relevant art(s) based on the discussion provided herein. Single-ended circuits are simpler. However, differential circuits provide better immunity to crosstalk and better second-order distortion, as is understood by those skilled in the relevant art(s).

A television receiver front-end circuit has just been described that is cascadable to drive multiple tuners from a single source, without degradation. One significant advantage of this invention is that frequency bands are split with good termination, without the use of a buffer. A further advantage includes providing frequency selectivity without compromising the ability of the cascaded tuners to receive signals across the entire frequency band, for both terrestrial and cable television applications. It also maintains a good input match (or large return loss) across the entire frequency band, which is particularly important for cable television applications. In addition, it is easily implemented with a small number of low-cost discrete components.

Conclusion

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:
1. A tuner front-end circuit for processing a radio frequency (RF) signal, the tuner front-end circuit comprising:
a first filter block that receives the RF signal, terminates one or more unwanted frequency bands from the RF signal, and outputs an unterminated signal;
a second filter block that receives the unterminated signal, provides selectivity by filtering the unterminated signal into a plurality of separate signals, each of the plurality of separate signals being of a different desired frequency band, and outputs the plurality of separate signals; and an amplifier block that amplifies each of the plurality of separate signals and outputs each amplified separate signal, wherein the second filter block includes a sis;nal bypass configured to receive the unterminated signal from the first filter block and output the received unterminated signal to the amplifier block such that the received unterminated signal bypasses the filtering of the second filter block.

2. The tuner front-end circuit of claim 1, wherein the first filter block comprises:

one or more parallel frequency selective terminating circuits, wherein each of the one or more frequency selective terminating circuits include a resistor, an inductor, and a capacitor, such that the RF signal is terminated for a particular unwanted frequency band.

3. The tuner front-end circuit of claim 2, wherein the resistor provides approximately 75 ohms of resistance.

4. The tuner front-end circuit of claim 2, wherein the first filter block comprises two parallel frequency selective terminating circuits, one that terminates the RF signal for a frequency band in the range of 88-175 MHz and another that terminates the RF signal for a frequency band in the range of 215-470 MHz.

5. The tuner front-end circuit of claim 2, wherein the resistor, inductor and capacitor are connected in series for each of the frequency selective terminating circuits.

6. The tuner front-end circuit of claim 1, wherein the second filter block comprises a plurality of series resonant circuits, parallel to each other, such that each of the plurality of series resonant circuits filter the unterminated signal into a particular separate signal of a particular desired frequency band.

7. The tuner front-end circuit of claim 6, wherein each of the plurality of series resonant circuits comprise an inductor and a capacitor in series and a grounded resistor, such that the grounded resistor terminates the signal and the inductor and capacitor provide a bandpass filter.

8. The tuner front-end circuit of claim 7, wherein the second filter block comprises three series resonant circuits, a first series resonant circuit that filters the unterminated signal into a first desired frequency band in the range of 54-88 MHz, a second series resonant circuit that filters the unterminated signal into a second desired frequency band in the range of 175-215 MHz, and a third series resonant circuit that filters the unterminated signal into a third desired frequency band in the range of 470-750 MHz.

9. The tuner front-end circuit of claim 1, wherein the amplifier block comprises a plurality of amplifiers, one or more of the amplifiers each associated with one of the separate signals output from the second filter block.

10. The tuner front-end circuit of claim 9, wherein each of the plurality of amplifiers has its own automatic gain control (AGC) loop to ensure that signals received by each of the plurality of amplifiers are amplified to substantially even power levels.

11. The tuner front-end circuit of claim 9, wherein the amplifier block comprises four amplifiers, one amplifier associated with a cable television signal, one associated with a VHF Low signal, one associated with a VHF High signal, and one associated with a UHF signal.

12. The tuner front-end circuit of claim 11, wherein the amplifier associated with the cable television signal is controlled by a separate RF input signal.

13. The tuner front-end circuit of claim 1, further comprising a daisy chain output block that receives the amplified separate signals output from the amplifier block and outputs one or more of the amplified separate signals.

14. The tuner front-end circuit of claim 13, wherein two or more of the amplified separate signals that are terrestrial are recombined into a recombined terrestrial signal.

15. The tuner front-end circuit of claim 14, wherein the daisy chain output block comprises:

a switch that selects among the recombined terrestrial signal and remaining amplified separate signals; and one or more amplifiers that output the selected signals.

16. The tuner front-end circuit of claim 15, wherein the daisy chain output block further comprises an inter-integrated circuit ($I^2C$) that controls the switch.

17. The tuner front-end circuit of claim 13, wherein the daisy chain output block comprises:

one or more amplifiers, such that each of the one or more amplifiers output one of the amplified separate signals.

18. The tuner front-end circuit of claim 1, further comprising:

a tracking filter block that receives the amplified separate signals, provides further selectivity to the amplified separate signals, and rejects signals at specific harmonics to prevent the degradation of a signal-to-noise ratio.

19. The tuner front-end circuit of claim 18, wherein the tracking filter block comprises:

a first set of switches that select between a cable television signal and terrestrial television signals;

a set of bandpass filters, each bandpass filter associated with one of the terrestrial television signals and associated with the cable television signal; and a second set of switches that select from which bandpass filters one or more resulting signals are output.

20. The tuner front-end circuit of claim 19, wherein the tracking filter block further comprises an inter-integrated circuit ($I^2C$) that controls the first and second sets of switches.

21. The tuner front-end circuit of claim 19, further comprising a daisy chain output block that receives the amplified separate signals output from the amplifier block and outputs one or more of the amplified separate signals.

22. The tuner front-end circuit of claim 21, wherein two or more of the amplified separate signals that are terrestrial are recombined into a recombined terrestrial signal.

23. The tuner front-end circuit of claim 22, wherein the daisy chain output block comprises:

a daisy chain switch that selects among the recombined terrestrial signal and remaining amplified separate signals; and one or more amplifiers that output the selected signals.

24. The tuner front-end circuit of claim 23, further comprising an inter-integrated circuit ($I^2C$) that controls the first and second sets of switches and the daisy chain switch.

25. The tuner front end circuit of claim 21, wherein the daisy chain output block comprises:

a plurality of amplifiers, such that each of the plurality of amplifiers output one of the amplified separate signals.

26. The tuner front-end circuit of claim 1, wherein the first filter block, the second filter block, and the amplifier block are single-ended circuits.

27. The tuner front-end circuit of claim 1, wherein the first filter block, the second filter block, and the amplifier block are differential circuits.

28. A television tuner system comprising:

a tuner front-end circuit having a first filter block that receives an RF signal, terminates the RF signal for one or more unwanted frequency bands, and outputs an unterminated signal;

a second filter block that receives the unterminated signal, provides selectivity by filtering the unterminated signal into a plurality of separate signals, each of the plurality of separate signals being of a different desired frequency band, and outputs the plurality of separate signals; and an amplifier block that amplifies each of the plurality of separate signals and outputs each amplified separate signal, wherein the second filter block includes a signal bypass configured to receive the unterminated signal from the first block and output the received unterminated signal to the amplifier block such that the received unterminated signal bypasses the filtering of the second filter block; and a tuner capable of receiving one or more of the amplified separate signals.

29. The television tuner system of claim 28, further comprising:

a tracking filter block that receives the amplified separate signals, provides further selectivity to the amplified separate signals, and rejects signals at specific harmonics to prevent the degradation of a signal-to-noise ratio, prior to passing one or more resulting signals to the tuner.

30. The television tuner system of claim 29, wherein the tracking filter block comprises:

a first set of switches that select between a cable television signal and terrestrial television signals;

a set of bandpass filters, each bandpass filter associated with one of the terrestrial television signals and associated with the cable television signal; and a second set of switches that select from which bandpass filters the one or more resulting signals get passed to the tuner.

31. The television tuner system of claim 28, further comprising:

one or more additional tuners; and a daisy chain output block in the tuner front-end circuit that receives the amplified separate signals output from the amplifier block and outputs one or more of the amplified separate signals to the one or more additional tuners.

32. The television tuner system of claim 31, farther comprising:

a tracking filter block in the tuner front-end circuit, located between the amplifier block and a main output, that receives the amplified separate signals, provides further selectivity to the amplified separate signals, and rejects signals at specific harmonics to prevent the degradation of a signal-to-noise ratio, prior to passing one or more resulting signals to the tuner; and one or more additional tracking filter blocks, located between the daisy chain output block and the one or more additional tuners, each additional tracking filter block associated with one of the one or more additional tuners, wherein the additional tracking filter blocks each receive the amplified separate signals from the daisy chain output block and process the amplified separate signals into corresponding resulting signals prior to passing one or more of the corresponding resulting signals to the corresponding additional tuners.

33. The television tuner system of claim 32, wherein the tuner front-end circuit, the tracking filter blocks and the tuners are implemented across one or more integrated circuit chips.

34. A method of processing a radio frequency (RF) signal, comprising:

receiving the RF signal;

terminating the RF signal for unwanted frequency bands to produce an unterminated signal;

separating the unterminated signal into a plurality of separate signals of differing desired frequency bands to provide selectivity, including bypassing the separating for an equivalent version of the unterminated signal to produce an separated signal;

amplifying each of the plurality of separate signals and the unseparated signal; and outputting the amplified separate signals and the amplified unseparated signal.

35. The method of claim 34, wherein the amplifying step amplifies each of the plurality of separate signals using automatic gain control to ensure that the separate signals are amplified to substantially even power levels.

36. The method of claim 34, further comprising:

receiving an additional RF signal;

amplifying the additional RF signal for cable television; and outputting the amplified additional RF signal.

37. The method of claim 34, further comprising:

providing one or more of the amplified separate signals to one or more tuners.

38. The method of claim 34, further comprising:

recombining two or more of the amplified separate signals into a recombined signal.

39. The method of claim 38, further comprising:

selecting among the recombined signal and remaining amplified separate signals; and outputting the selected signals.

40. The method of claim 34, further comprising:

filtering the amplified separate signals to provide further selectivity for each of the amplified separate signals and to reject signals at specific harmonics to prevent the degradation of a signal-to-noise ratio.

41. The method of claim 34, further comprising:

filtering the amplified separate signals to provide further selectivity for each of the amplified separate signals and to reject signals at specific harmonics to prevent the degradation of a signal-to-noise ratio; and outputting one or more of the filtered amplified separate signals to one or more tuners.

\* \* \* \* \*

UNITED STATES PATENT AND TRADEMARK OFFICE
CERTIFICATE OF CORRECTION

| | | |
|---|---|---|
| PATENT NO. | : 8,457,574 B2 | Page 1 of 1 |
| APPLICATION NO. | : 11/878751 | |
| DATED | : June 4, 2013 | |
| INVENTOR(S) | : Ramon Gomez | |

It is certified that error appears in the above-identified patent and that said Letters Patent is hereby corrected as shown below:

In the Claims:

Column 9, line 4, claim 1, please replace "sis;nal" with --signal--.
Column 11, line 12, claim 28, please replace "first block" with --first filter block--.
Column 11, line 43, claim 32, please replace "farther" with --further--.
Column 12, line 20, claim 34, please replace "an separated signal" with --an unseparated signal--.

Signed and Sealed this
Sixth Day of August, 2013

Teresa Stanek Rea
*Acting Director of the United States Patent and Trademark Office*